United States Patent
Hioka

(10) Patent No.: US 8,743,611 B2
(45) Date of Patent: Jun. 3, 2014

(54) NON-VOLATILE SEMICONDUCTOR MEMORY DEVICE

(75) Inventor: Takeshi Hioka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 80 days.

(21) Appl. No.: 13/600,936

(22) Filed: Aug. 31, 2012

(65) Prior Publication Data

US 2013/0242651 A1 Sep. 19, 2013

(30) Foreign Application Priority Data

Sep. 20, 2011 (JP) ................................ 2011-204699

(51) Int. Cl.
*G11C 11/34* (2006.01)

(52) U.S. Cl.
USPC ............ 365/185.11; 365/185.17; 365/185.18; 365/185.23; 365/185.27; 365/185.29

(58) Field of Classification Search
USPC ............. 365/185.11, 185.17, 185.18, 185.23, 365/185.27, 185.29
See application file for complete search history.

(56) References Cited

U.S. PATENT DOCUMENTS

| 8,339,856 B2* | 12/2012 | Iwata ........................ 365/185.17 |
| 8,514,627 B2* | 8/2013 | Itagaki et al. ............ 365/185.18 |
| 2005/0213385 A1 | 9/2005 | Hosono et al. |
| 2005/0275004 A1 | 12/2005 | Watanabe |
| 2009/0230449 A1 | 9/2009 | Sakaguchi et al. |
| 2010/0090188 A1 | 4/2010 | Futatsuyama |
| 2011/0175159 A1 | 7/2011 | Itagaki et al. |

FOREIGN PATENT DOCUMENTS

| JP | 2005-285185 | 10/2005 |
| JP | 2005-353760 | 12/2005 |
| JP | 2009-224565 | 10/2009 |
| JP | 2010-80729 | 4/2010 |

\* cited by examiner

*Primary Examiner* — Trong Phan
(74) *Attorney, Agent, or Firm* — Oblon, Spivak, McClelland, Maier & Neustadt, L.L.P.

(57) ABSTRACT

A first capacitor includes a plurality of first conductive layers and second conductive layers. The first conductive layers function as a first electrode of the first capacitor, the second conductive layers function as a second electrode of the first capacitor. The first conductive layers and the second conductive layers are arranged alternately in the direction substantially perpendicular to a semiconductor substrate. A control circuit is configured to control a voltage applied to each of first conductive layers and the second conductive layers according to voltages of gates of a plurality of memory transistors, thereby changing a capacitance of the first capacitor.

20 Claims, 9 Drawing Sheets

FIG. 5
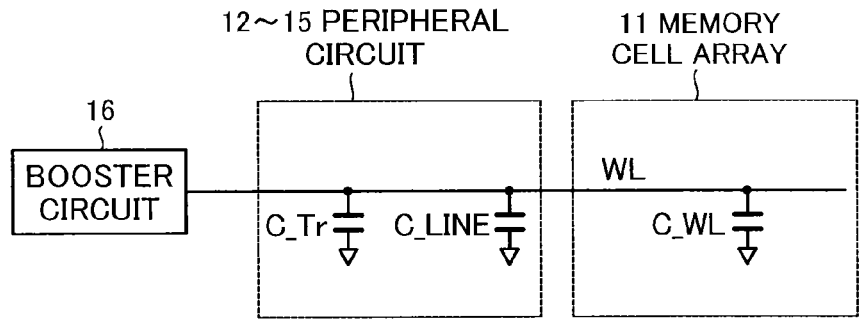
FIG. 6A
FIG. 6B
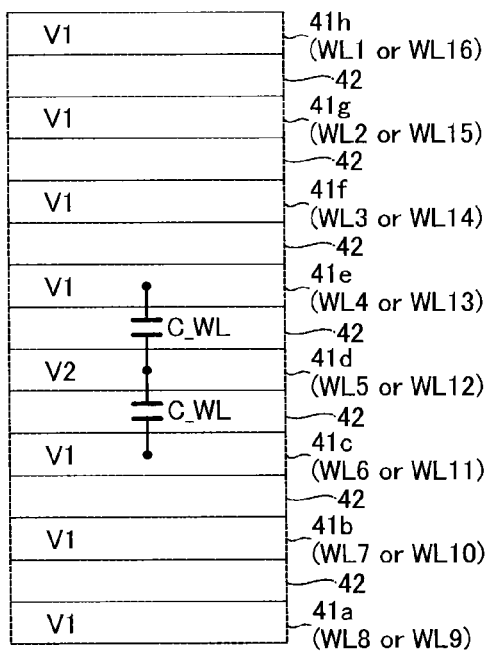
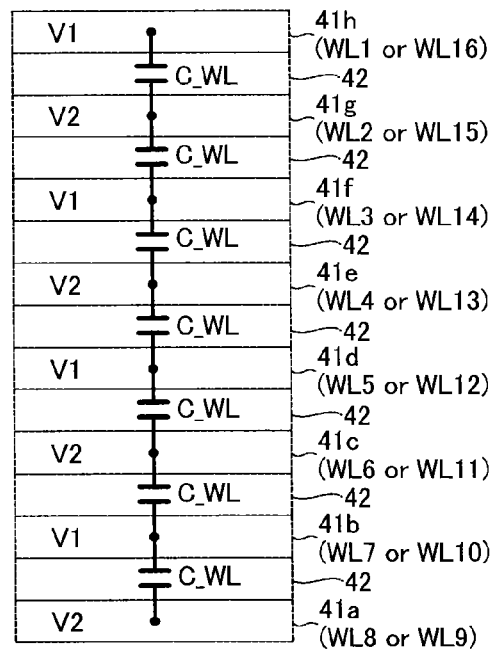

NON-VOLATILE SEMICONDUCTOR MEMORY DEVICE

CROSS-REFERENCE TO RELATED APPLICATIONS

This application is based upon and claims the benefit of priority from the prior Japanese Patent Application No. 2011-204699, filed on Sep. 20, 2011, the entire contents of which are incorporated herein by reference.

FIELD

The embodiments relate to a nonvolatile semiconductor memory device.

BACKGROUND

In recent years, many semiconductor memory devices have been proposed in which memory cells are three-dimensionally arranged in order to increase the degree of integration of a memory.

Similarly to a conventional semiconductor memory device having a planar structure according to the related art, the above-mentioned semiconductor memory device requires a capacitive element (capacitor). The capacitive element is used to boost a power supply voltage or it is used as a protection element. It is necessary to reduce the occupied area of the capacitive element, similarly to a memory cell.

BRIEF DESCRIPTION OF THE DRAWINGS

FIG. 5 is a diagram illustrating parasitic capacitance according to the first embodiment.

FIGS. 6A and 6B are diagrams illustrating an example in which the capacitances C_WL between word lines WL1 to WL16 are changed.

DETAILED DESCRIPTION

According to an aspect, a non-volatile semiconductor memory device includes a semiconductor substrate, a memory string, a first capacitor, and a control circuit. The memory string is provided above the semiconductor substrate and includes a plurality of memory transistors connected in series. The plurality of memory transistors are stacked above the semiconductor substrate. The first capacitor is provided above the semiconductor substrate. The control circuit is configured to control a voltage applied to the memory string and the first capacitor. The first capacitor includes a plurality of first conductive layers and second conductive layers. The first conductive layers function as a first electrode of the first capacitor, the second conductive layers function as a second electrode of the first capacitor. The first conductive layers and the second conductive layers are arranged alternately in the direction substantially perpendicular to the semiconductor substrate. The control circuit is configured to control a voltage applied to each of the plurality of first conductive layers and second conductive layers according to voltages of gates of the plurality of memory transistors, thereby changing a capacitance of the first capacitor.

Hereinafter, a non-volatile semiconductor memory device according to an embodiment will be described with reference to the accompanying drawings.

[First Embodiment]

[Schematic Structure]

Figure 1:
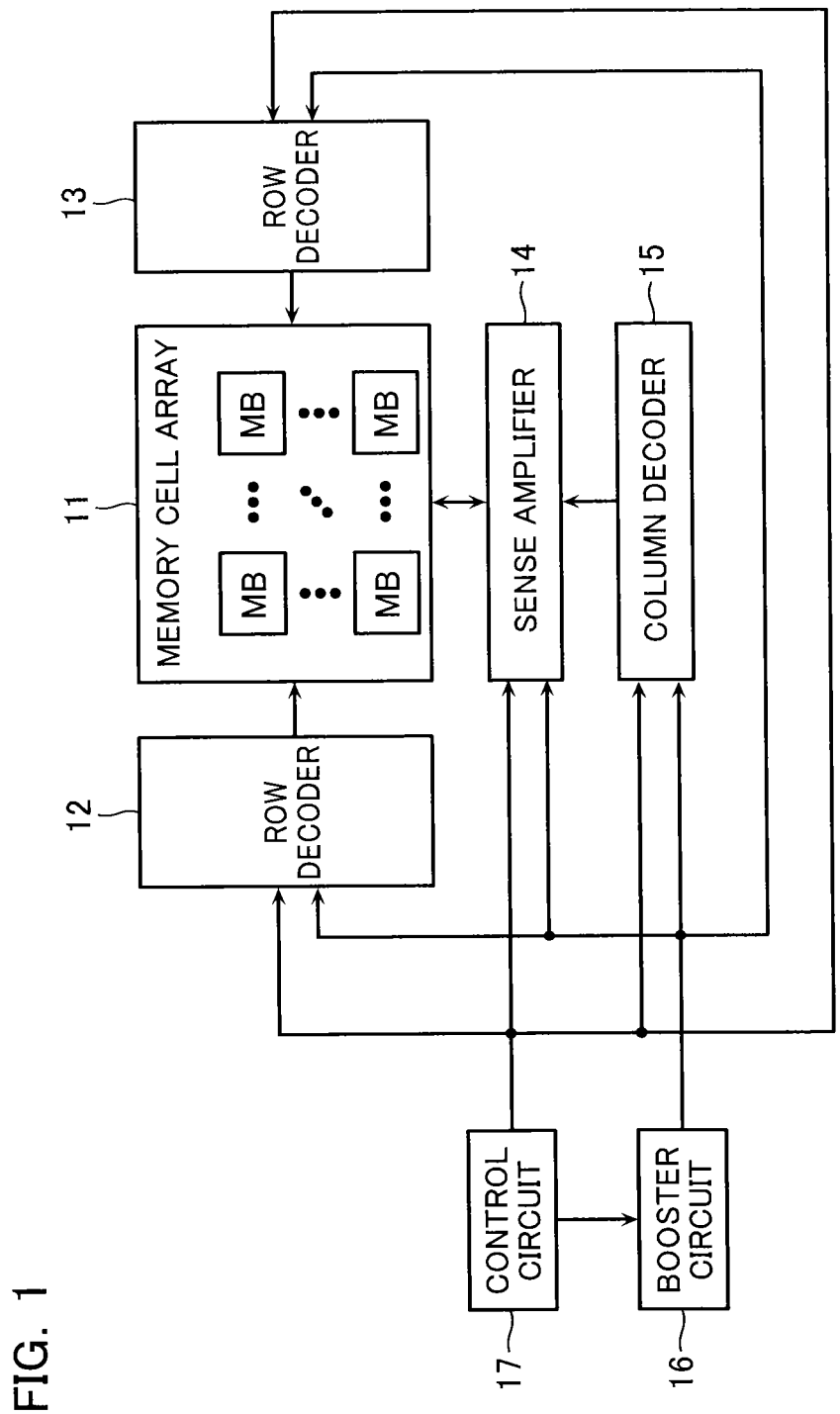
FIG. 1 is a block diagram illustrating a non-volatile semiconductor memory device according to a first embodiment.

Hereinafter, a structure of a non-volatile semiconductor memory device according to a first embodiment will be described. FIG. 1 is a block diagram illustrating the non-volatile semiconductor memory device according to the first embodiment.

As illustrated in FIG. 1, the non-volatile semiconductor memory device according to the first embodiment includes a memory cell array 11, row decoders 12 and 13, a sense amplifier 14, a column decoder 15, a booster circuit 16, and a control circuit 17.

The memory cell array 11 includes a plurality of memory blocks MB. In each memory block MB, a plurality of memory transistors MTr which store data in a non-volatile manner are three-dimensionally arranged. The memory block MB forms a minimum erasing unit in which data is collectively erased when a data erasing operation is performed.

As illustrated in FIG. 1, the row decoders 12 and 13 have a function of decoding a row address signal and selecting a word line. The sense amplifier 14 reads data from the memory cell array 11. The column decoder 15 has a function of decoding a column address signal and selecting a bit line.

The booster circuit 16 generates a high voltage required for a writing operation or an erasing operation and supplies the generated voltage to the row decoders 12 and 13, the sense amplifier 14, and the column decoder 15. The control circuit 17 controls the row decoders 12 and 13, the sense amplifier 14, the column decoder 15, and the booster circuit 16.

Figure 2:
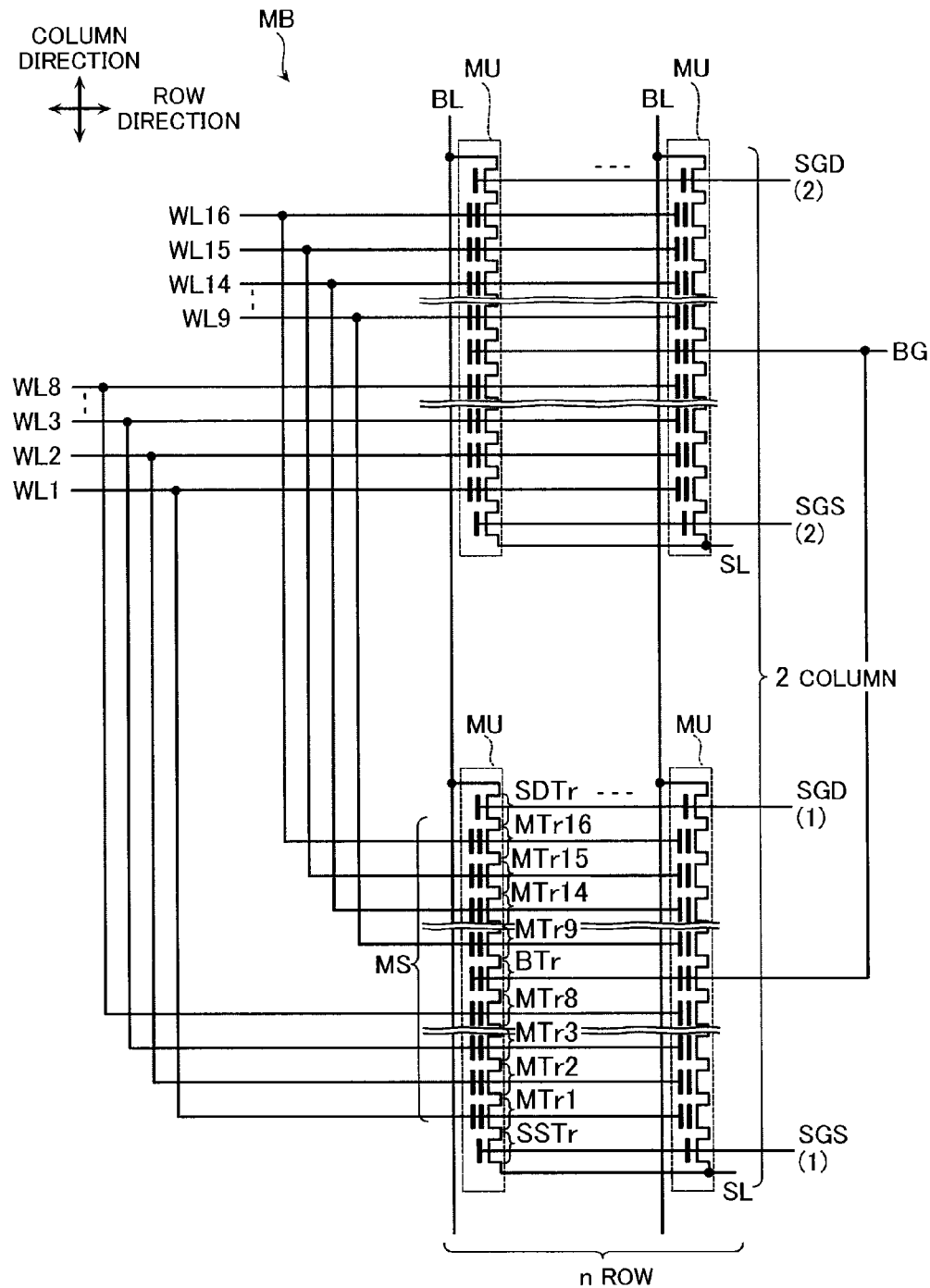
FIG. 2 is a circuit diagram illustrating a memory block MB according to the first embodiment.

Next, the detailed structure of the memory block MB will be described with reference to FIG. 2. As illustrated in FIG. 2, the memory block MB includes a plurality of bit lines BL, a plurality of source lines SL, and a plurality of memory units MU connected to the bit lines BL and the source lines SL.

The memory block MB includes the memory units MU which are arranged in a matrix of n rows and two columns. The matrix of n rows and two columns is illustrative, and the invention is not limited thereto.

One end of the memory unit MU is connected to the bit line BL and the other end of the memory unit MU is connected to the source line SL. A plurality of bit lines BL are arranged at predetermined pitches in the row direction and extend in the column direction.

The memory unit MU includes a memory string MS, a source-side selection transistor SSTr, and a drain-side selection transistor SDTr.

Figure 3:
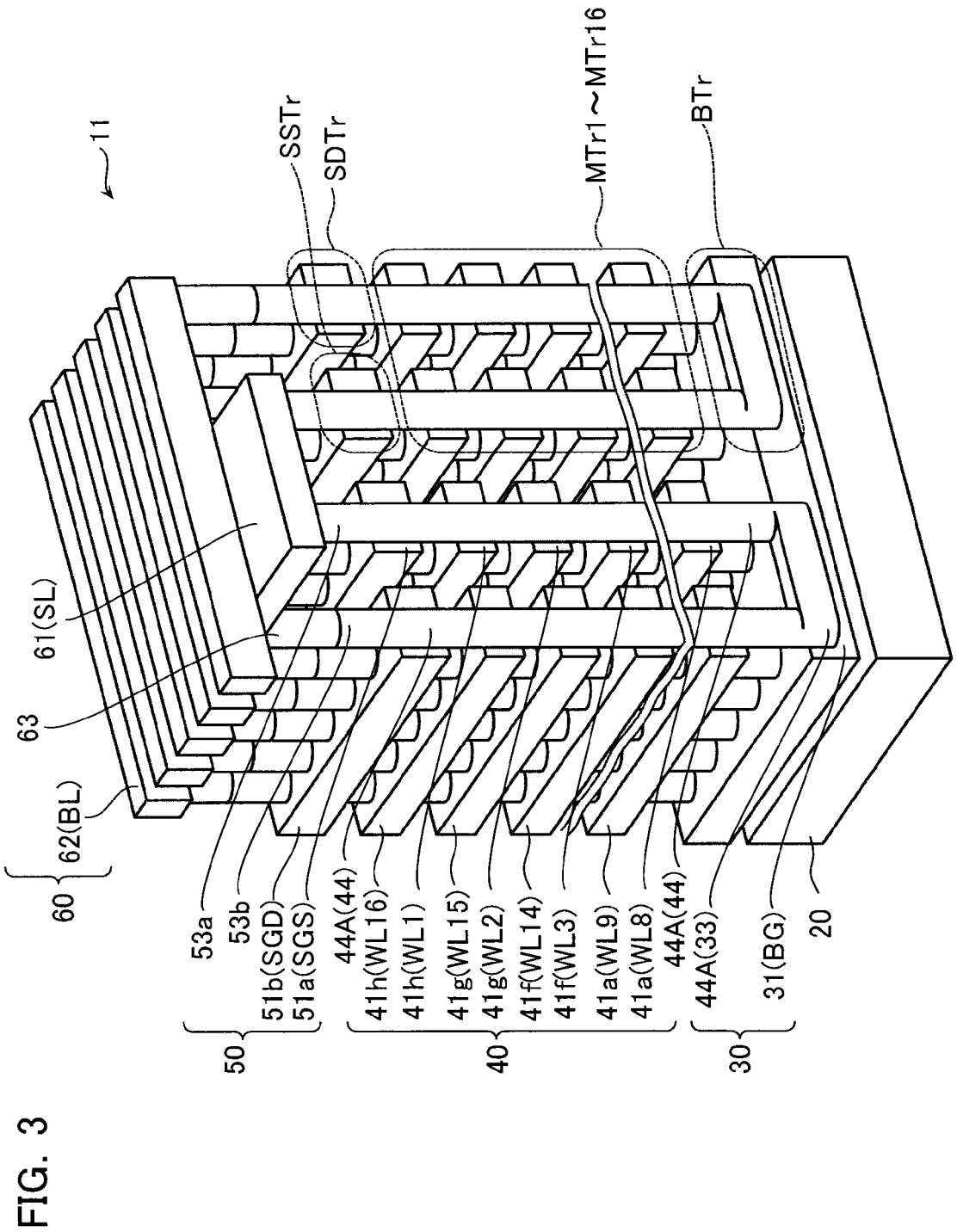
FIG. 3 is a perspective view illustrating the laminated structure of a memory cell array 11 according to the first embodiment.

As illustrated in FIG. 2, the memory string MS includes memory transistors MTr1 to MTr16 (memory cells) and a back gate transistor BTr connected in series. The memory transistors MTr1 to MTr8 are connected in series to each other and the memory transistors MTr9 to MTr16 are connected in series to each other. The back gate transistor BTr is connected between the memory transistor MTr8 and the memory transistor MTr9. As illustrated in FIG. 3, which will be described below, the memory transistors MTr1 to MTr16 are three-dimensionally arranged in the row direction, the column direction, and the laminated direction (a direction substantially perpendicular to a semiconductor substrate).

The memory transistors MTr1 to MTr16 store charges in their charge storage layers, thereby holding data. The back gate transistor BTr is turned on at least when the memory string MS is selected as an operation target.

Word lines WL1 to WL16 are commonly connected to gates of the memory transistors MTr1 to MTr16 arranged in a matrix of n rows and two columns in the memory block MB. A common back gate line BG is connected to gates of the back gate transistors BTr arranged in a matrix of n rows and two columns.

A drain of the source-side selection transistor SSTr is connected to a source of the memory string MS. A source of the source-side selection transistor SSTr is connected to the source line SL. A common source-side selection line SGS(1) or SGS(2) is connected to gates of n source-side selection transistors SSTr arranged in a line in the row direction in the memory block MB. In the following description, in some cases, the source-side selection lines SGS(1) and SGS(2) are generically referred to as a source-side selection line SGS without distinction.

A source of the drain-side selection transistor SDTr is connected to a drain of the memory string MS. A drain of the drain-side selection transistor SDTr is connected to the bit line BL. A common drain-side selection line SGD(1) or SGD(2) is connected to gates of n drain-side selection transistors SDTr which are arranged in a line in the row direction in the memory block MB.

In the following description, in some cases, the drain-side selection lines SGD(1) and SGD(2) are generically referred to as a drain-side selection line SGD without distinction.

[Laminated Structure of Memory Cell Array 11]

Figure 4:
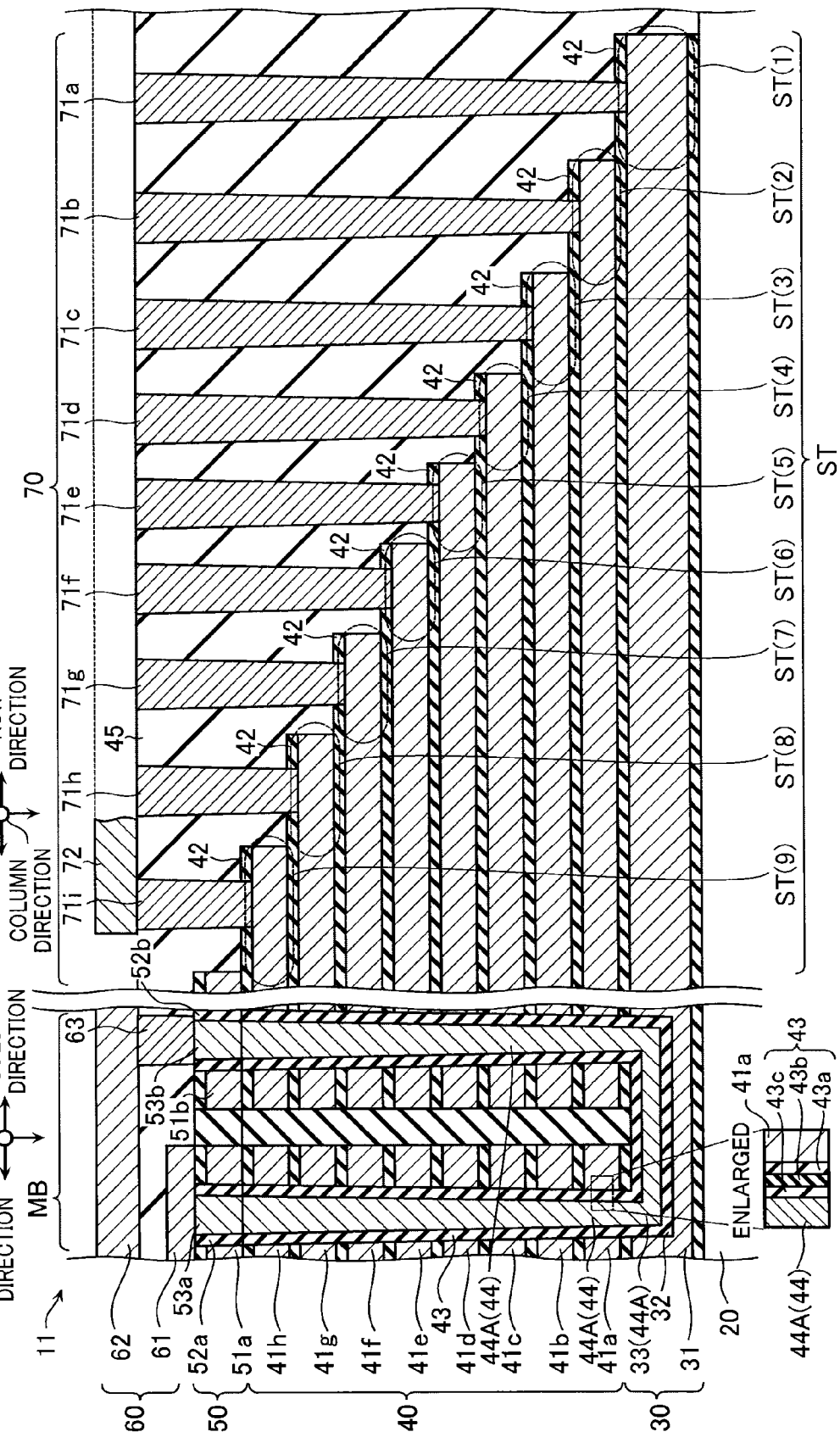
FIG. 4 is a cross-sectional view illustrating the laminated structure of the memory cell array 11 according to the first embodiment.

Next, a laminated structure of the memory cell array 11 will be described with reference to FIGS. 3 and 4. As illustrated in FIGS. 3 and 4, the memory cell array 11 includes a back gate layer 30, a memory layer 40, a selection transistor layer 50, and a wiring layer 60 which are sequentially formed on a semiconductor substrate 20. The back gate layer 30 functions as the back gate transistor BTr. The memory layer 40 functions as the memory transistors MTr1 to MTr8. The selection transistor layer 50 functions as the drain-side selection transistor SDTr and the source-side selection transistor SSTr. The wiring layer 60 functions as the source line SL and the bit line BL.

As illustrated in FIGS. 3 and 4, the back gate layer 30 includes a back gate conductive layer 31. The back gate conductive layer 31 functions as the back line BG and the gate of the back gate transistor BTr. The back gate conductive layer 31 two-dimensionally extends in a plate shape in the row direction and the column direction parallel to the semiconductor substrate 20. The back gate conductive layer 31 is made of, for example, polysilicon (poly-Si).

As illustrated in FIG. 4, the back gate layer 30 includes a memory gate insulating layer 32 and a semiconductor layer 33. The semiconductor layer 33 functions as a body (channel) of the back gate transistor BTr.

The memory gate insulating layer 32 comes into contact with a side surface of the back gate conductive layer 31. The semiconductor layer 33 sandwiches the memory gate insulating layer 32 with the back gate conductive layer 31.

The semiconductor layer 33 is formed so as to be buried in the back gate conductive layer 31. The semiconductor layer 33 has a substantially rectangular shape having the column direction as the longitudinal direction, as viewed from the upper side. The semiconductor layer 33 is arranged in a matrix in the row direction and the column direction in one memory block MB. The semiconductor layer 33 is made of polysilicon (poly-Si).

In other words, in the structure of the back gate layer 30, the back gate conductive layer 31 surrounds a side surface and a lower surface of the semiconductor layer 33, with the memory gate insulating layer 32 interposed therebetween.

As illustrated in FIGS. 3 and 4, the memory layer 40 is formed on the back gate layer 30. The memory layer 40 includes eight word line conductive layers 41a to 41h and eight interlayer insulating layers 42. The word line conductive layer 41a functions as the word line WL8 and the gate of the memory transistor MTr8. In addition, the word line conductive layer 41a functions as the word line WL9 and the gate of the memory transistor MTr9. Similarly, the word line conductive layers 41b to 41h function as the word lines WL1 to WL7 and the gates of the memory transistors MTr1 to MTr7, respectively. In addition, the word line conductive layers 41b to 41h function as the word lines WL10 to WL16 and the gates of the memory transistors MTr10 to MTr16, respectively.

The word line conductive layers 41a to 41h are laminated with the interlayer insulating layers 42 interposed therebetween. The word line conductive layers 41a to 41h are arranged at predetermined pitches in the column direction and extend in the row direction (direction perpendicular to the plane of FIG. 3) as the longitudinal direction. The word line conductive layers 41a to 41h are made of, for example, polysilicon (poly-Si).

The interlayer insulating layers 42 are provided between the word line conductive layers 41a to 41h in the vertical direction. The interlayer insulating layer 42 is made of, for example, a silicon oxide ($SiO_2$).

As illustrated in FIG. 4, the memory layer 40 includes a memory gate insulating layer 43 and a columnar semiconductor layer 44. The columnar semiconductor layer 44 functions as the bodies (channels) of the memory transistors MTr1 to MTr16.

The memory gate insulating layer 43 comes into contact with a side surfaces of the word line conductive layers 41a to 41h. The memory gate insulating layer 43 is continuous with the memory gate insulating layer 32 and is formed integrally therewith. The memory gate insulating layer 43 includes a block insulating layer 43a, a charge storage layer 43b, and a tunnel insulating layer 43c which are arranged in this order from the side surfaces of the word line conductive layer 41a to 41h to the columnar semiconductor layer 44. The charge storage layer 43b is configured so as to store charge.

The block insulating layer 43a is formed with a predetermined thickness on the side walls of the word line conductive layers 41a to 41h. The charge storage layer 43b is formed with a predetermined thickness on a side wall of the block insulating layer 43a. The tunnel insulating layer 43c is formed with a predetermined thickness on a side wall of the charge storage layer 43b. The block insulating layer 43a and the tunnel insulating layer 43c are made of a silicon oxide (SiO$_2$). The charge storage layer 43b is made of a silicon nitride (SiN).

A side surface of the columnar semiconductor layer 44 sandwiches the memory gate insulating layer 43 with the word line conductive layers 41a to 41h. The columnar semiconductor layer 44 passes through the word line conductive layers 41a to 41h. The columnar semiconductor layer 44 extends in a direction substantially perpendicular to the semiconductor substrate 20. A pair of columnar semiconductor layers 44 are continuous with the semiconductor layer 33 and is formed integrally therewith. The pair of columnar semiconductor layers 44 are matched with each other in the vicinity of the end of the semiconductor layer 33 in the column direction. The columnar semiconductor layer 44 is made of polysilicon (poly-Si).

In the back gate layer 30 and the memory layer 40, the pair of columnar semiconductor layers 44 and the semiconductor layer 33 joining the lower ends of the columnar semiconductor layers 44 form a memory semiconductor layer 44A functioning as the body (channel) of the memory string MS. The memory semiconductor layer 44A is formed in a U shape, as viewed from the row direction.

In other words, in the structure of the memory layer 40, the word line conductive layers 41a to 41h surround the side surfaces of the columnar semiconductor layers 44, with the memory gate insulating layer 43 interposed therebetween.

As illustrated in FIGS. 3 and 4, the selection transistor layer 50 includes a source-side conductive layer 51a and a drain-side conductive layer 51b. The source-side conductive layer 51a functions as the source-side selection line SGS and the gate of the source-side selection transistor SSTr. The drain-side conductive layer 51b functions as the drain-side selection line SGD and the gate of the drain-side selection transistor SDTr.

The source-side conductive layer 51a is formed on one of the columnar semiconductor layers 44 forming the memory semiconductor layer 44A. The drain-side conductive layer 51b is the same layer as the source-side conductive layer 51a and is formed on the other one of the columnar semiconductor layers 44 forming the memory semiconductor layer 44A. A plurality of source-side conductive layers 51a and drain-side conductive layers 51b are arranged at predetermined pitches in the column direction and extend in the row direction. The source-side conductive layer 51a and the drain-side conductive layer 51b are made of, for example, polysilicon (poly-Si).

As illustrated in FIG. 4, the selection transistor layer 50 includes a source-side gate insulating layer 52a, a source-side columnar semiconductor layer 53a, a drain-side gate insulating layer 52b, and a drain-side columnar semiconductor layer 53b. The source-side columnar semiconductor layer 53a functions as the body (channel) of the source-side selection transistor SSTr. The drain-side columnar semiconductor layer 53b functions as a body (channel) of the drain-side selection transistor SDTr.

The source-side gate insulating layer 52a comes into contact with a side surface of the source-side conductive layer 51a. The source-side gate insulating layer 52a is made of, for example, a silicon oxide (SiO$_2$).

The source-side columnar semiconductor layer 53a sandwiches the source-side gate insulating layer 52a with the source-side conductive layer 51a. The source-side columnar semiconductor layer 53a passes through the source-side conductive layer 51a. The source-side columnar semiconductor layer 53a is connected to an upper surface of one of the pair of columnar semiconductor layers 44 and has a columnar shape which extends in the direction substantially perpendicular to the semiconductor substrate 20. The source-side columnar semiconductor layer 53a is made of polysilicon (poly-Si).

The drain-side gate insulating layer 52b comes into contact with the side surface of the drain-side conductive layer 51b. The drain-side gate insulating layer 52b is made of, for example, a silicon oxide (SiO$_2$).

The drain-side columnar semiconductor layer 53b sandwiches the drain-side gate insulating layer 52b with the drain-side conductive layer 51b. The drain-side columnar semiconductor layer 53b passes through the drain-side conductive layer 51b. The drain-side columnar semiconductor layer 53b is connected to an upper surface of one of the pair of columnar semiconductor layers 44 and has a columnar shape which extends in the direction substantially perpendicular to the semiconductor substrate 20. The drain-side columnar semiconductor layer 53b is made of polysilicon (poly-Si).

In other words, in the structure of the selection transistor layer 50, the source-side conductive layer 51a surrounds a side surface of the source-side columnar semiconductor layer 53a with the source-side gate insulating layer 52a interposed therebetween. The drain-side conductive layer 51b surrounds a side surface of the drain-side columnar semiconductor layer 53b with the drain-side gate insulating layer 52b interposed therebetween.

The wiring layer 60 includes a source line layer 61, a bit line layer 62, and a plug layer 63. The source line layer 61 functions as the source line SL. The bit line layer 62 functions as the bit line BL.

The source line layer 61 comes into contact with an upper surface of the source-side columnar semiconductor layer 53a and extends in the row direction. The bit line layer 62 comes into contact with an upper surface of the drain-side columnar semiconductor layer 53b through the plug layer 63 and extends in the column direction. The source line layer 61, the bit line layer 62, and the plug layer 63 are made of a metal material, such as tungsten.

Next, a structure of a word line contact portion 70 which is disposed around the memory block MB will be described with reference to FIG. 4. The back gate conductive layer 31, the word line conductive layers 41a to 41h, and the source-side conductive layer 51a (drain-side conductive layer 51b) extend to the word line contact portion 70.

As illustrated in FIG. 4, the back gate conductive layer 31, the word line conductive layers 41a to 41h, and the source-side conductive layer 51a (drain-side conductive layer 51b) are formed in a step shape such that the ends thereof are disposed at different positions in the row direction, thereby forming a step portion ST. The step portion ST includes steps (stages) ST(1) to ST(9) which are arranged in a line in the row direction. As illustrated in FIG. 4, the steps ST(1) to ST(9) are arranged from the bottom to the top.

Contract layers 71a to 71i extending from the upper side are formed by the step portion ST. The contract layer 71a comes into contact with the upper surface (step ST(1)) of the back gate conductive layer 31. The contract layers 71b to 71i come into contact with the upper surfaces (steps ST(2) to ST(9)) of the word line conductive layers 41a to 41h, respectively. A lead line 72 which extends in a direction parallel to the semiconductor substrate 20 is provided on an upper surface of each of the contract layers 71a to 71i.

[Parasitic Capacitance]

Next, parasitic capacitance, which is a problem of this embodiment, will be described with reference to FIG. 5. As illustrated in FIG. 5, in this embodiment, the booster circuit 16 supplies a boosted voltage to the memory cell array 11 through the peripheral circuits 12 to 15, such as the row decoder 12. Therefore, in the peripheral circuits 12 to 15, junction capacitance C_Tr is formed between the gate and the source (or between the gate and the drain) of the transistors forming the peripheral circuits 12 to 15, and inter-line capacitance C_LINE is formed between the lines of the peripheral circuits 12 to 15. In the memory cell array 11, capacitance C_WL is formed between the word lines WL1 to WL16.

The values of the capacitances C_Tr and C_LINE are constant, regardless of various operations (for example, a writing operation, a reading operation, an erasing operation, and a verification operation) performed on the memory cell array 11. However, the capacitance C_WL varies depending on the content of various operations performed on the memory cell array 11. When the capacitance C_WL varies, the boosting time of the booster circuit also varies. As a result, the performance of the semiconductor memory device is reduced.

Next, examples of the variation in the capacitance C_WL between the word lines WL1 to WL16 will be described with reference to FIGS. 6A and 6B.

In the example illustrated in FIG. 6A, a voltage V2 is applied only to the word line conductive layer 41*d* (the word line WL5 or WL12) and a voltage V1 (V1<V2) is applied to the other word line conductive layers 41*a* to 41*c* and 41*e* to 41*h* (the word lines WL1 to WL4 and WL6 to WL8, or the word lines WL9 to WL11 and WL13 to WL16). During a writing operation, voltages (for example, V1=about 8 V to 10 V and V2=about 20 V to 23 V) illustrated in FIG. 6A are applied. In this example, the capacitance C_WL is formed between adjacent word line conductive layers 41*c* and 41*d* having a potential difference V2−V1 therebetween and the capacitance C_WL is also formed between adjacent word line conductive layers 41*d* and 41*e* having a potential difference V2−V1 therebetween.

In the example illustrated in FIG. 6B, the voltage V2 is applied to the word line conductive layers 41*a*, 41*c*, 41*e*, and 41*g* (the word lines WL1, WL3, WL5, and WL7, or the word lines WL10, WL12, WL14, and WL16) and the voltage V1 (V1<V2) is applied to the other word line conductive layers 41*b*, 41*d*, 41*f*, and 41*h* (the word lines WL2, WL4, WL6, and WL8, or the word lines WL9, WL11, WL13, and WL15). During an erasing verification operation, voltages (for example, V1=about 0 V and V2=about 6 V to 8 V) illustrated in FIG. 6B are applied. In this example, seven capacitances C_WL are formed between adjacent word line conductive layers 41*a* to 41*h* having the potential difference V2−V1 therebetween. As illustrated in FIGS. 6A and 6B, the voltages applied to the word line conductive layers 41*a* to 41*h* (word lines WL1 to WL16) vary depending on various operations (for example, a writing operation and an erasing verification operation). Therefore, the capacitances C_WL between the word lines WL1 to WL16 are changed depending on various operations.

[Structure of Booster Circuit 16]

Figure 7:
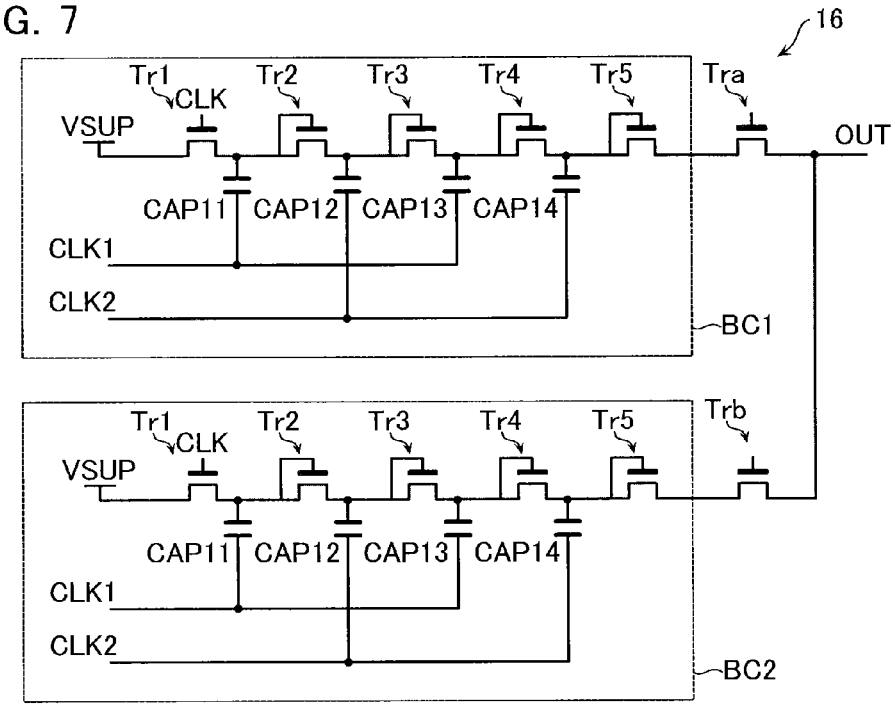
FIG. 7 is a circuit diagram illustrating a booster circuit 16 according to the first embodiment.

Next, the structure of the booster circuit 16 according to the first embodiment will be described with reference to FIG. 7. The booster circuit 16 generates a voltage higher than a voltage VSUP using the charging and discharging of the capacitor (capacitive element). As illustrated in FIG. 7, the booster circuit 16 includes booster units BC1 and BC2 and transmission transistors Tra and Trb.

Each of the booster units BC1 and BC2 includes transistors Tr1 to Tr5 and capacitors CAP11 to CAP14 (capacitive elements). The transistors Tr1 to Tr5 are connected in series to each other. The voltage VSUP is applied to a drain of the transistor Tr1 and a clock signal CLK is applied to a gate of the transistor Tr1. The transistors Tr2 to Tr5 are diode-connected transistors. A clock signal CLK1 is supplied to one end of each of the capacitors CAP11 and CAP13. The other end of the capacitor CAP11 is connected to a node between the transistor Tr1 and the transistor Tr2 and the other end of the capacitor CAP13 is connected to a node between the transistor Tr3 and the transistor Tr4. A clock signal CLK2 is supplied to one end of each of the capacitors CAP12 and CAP14. The other end of the capacitor CAP12 is connected to a node between the transistor Tr2 and the transistor Tr3, and the other end of the capacitor CAP14 is connected to a node between the transistor Tr4 and the transistor Tr5. The charging and discharging of the capacitors CAP01 to CAP04 are repeated by the clocks CLK, CLK1, and CLK2 to generate the voltage higher than the voltage VSUP.

A drain of the transmission transistor Tra is connected to a source of the transistor Tr5 in the booster unit BC1. A drain of the transmission transistor Trb is connected to a source of the transistor Tr5 in the booster unit BC2 and the source of the transmission transistor Trb is connected to a source of the transmission transistor Tra. The sources of the transmission transistors Trb and Tra are connected to an output terminal OUT. The control circuit 17 controls a conductive state of the transmission transistors Tra and Trb, thereby controlling the boosting capability of the booster circuit 16.

When the capacitors CAP11 to CAP14 have fixed capacitances, it is difficult for the booster circuit 16 to respond to a variation in the capacitances C_WL between the word lines WL1 to WL16 illustrated in FIG. 5 and FIGS. 6A and 6B. Therefore, in this case, the boosting time of the booster circuit 16 varies according to the variation in the capacitances C_WL. As a result, the performance of the semiconductor memory device is reduced.

Therefore, in the first embodiment, the capacitors CAP11 to CAP14 are configured such that the capacitances thereof are changed according to a variation in the capacitances C_WL due to the voltages applied to the word lines WL1 to WL16. The control circuit 17 controls the capacitances of the capacitors CAP11 to CAP14.

[Structure of Capacitor CAP11]

Next, the structure of the capacitor CAP11 will be described with reference to FIG. 8. Since the capacitors CAP12 to CAP14 have the same structure as the capacitor CAP11, the description thereof will not be repeated.

Figure 8:
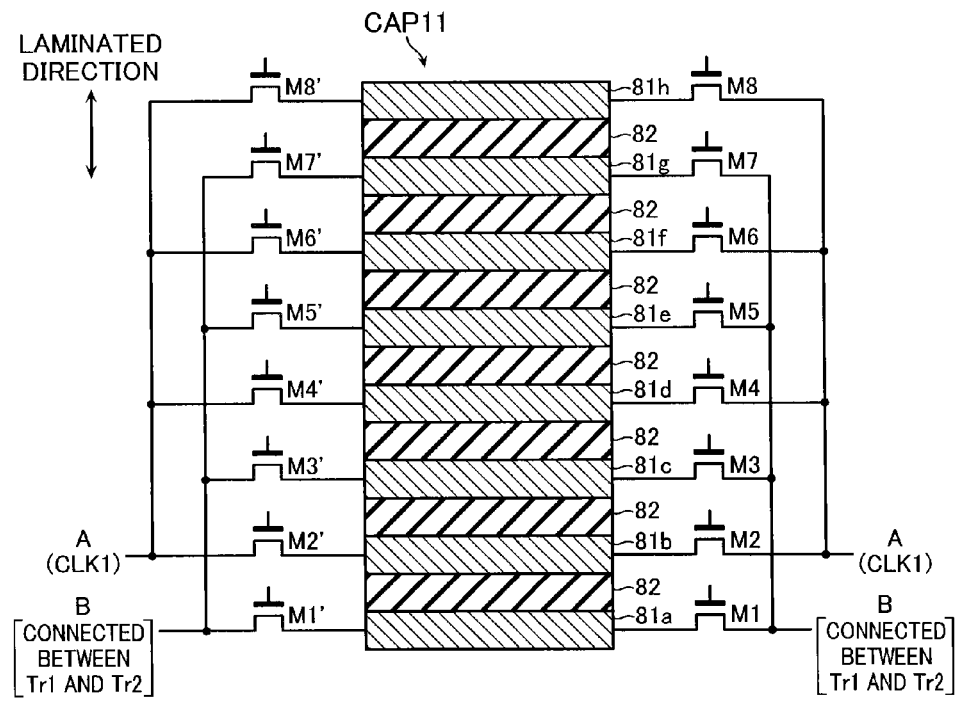
FIG. 8 is a diagram schematically illustrating the structure of a capacitor CAP11.

As illustrated in FIG. 8, the capacitor CAP11 includes conductive layers 81*a* to 81*h* and interlayer insulating layers 82. The conductive layers 81*a* to 81*h* are laminated with the interlayer insulating layers 82 interposed therebetween. The conductive layers 81*a* to 81*h* function as the electrode of the capacitor CAP11, and the interlayer insulating layer 82 functions as an inter-electrode dielectric film of the capacitor CAP11. The conductive layers 81*a* to 81*h* are made of, for example, polysilicon (poly-Si) and the interlayer insulating layer 82 is made of, for example, a silicon oxide ($SiO_2$).

The conductive layers 81*b*, 81*d*, 81*f*, and 81*h* are connected to a terminal A through transistors M2 (M2'), M4 (M4'), M6 (M6'), and M8 (M8'), respectively. The terminal A functions as one end of the capacitor CAP11 and is supplied with the clock signal CLK1. The conductive layers 81*a*, 81*c*, 81*e*, and 81*g* are connected to a terminal B through transistors M1 (M1'), M3 (M3'), M5 (M5'), and M7 (M7'), respectively. The terminal B functions as the other end of the capacitor CAP11 and is connected to the node between the transistor Tr1 and the transistor Tr2.

Figure 9:
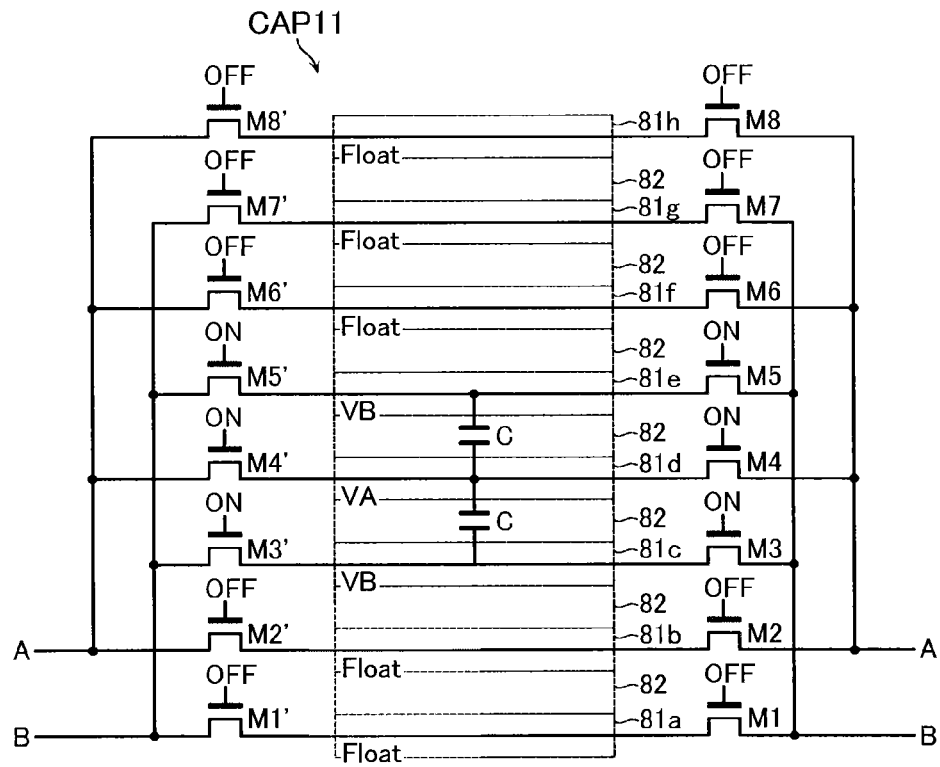
FIG. 9 is a diagram illustrating voltages applied to conductive layers 81a to 81h in the capacitor CAP11 according to the first embodiment.
Figure 10:
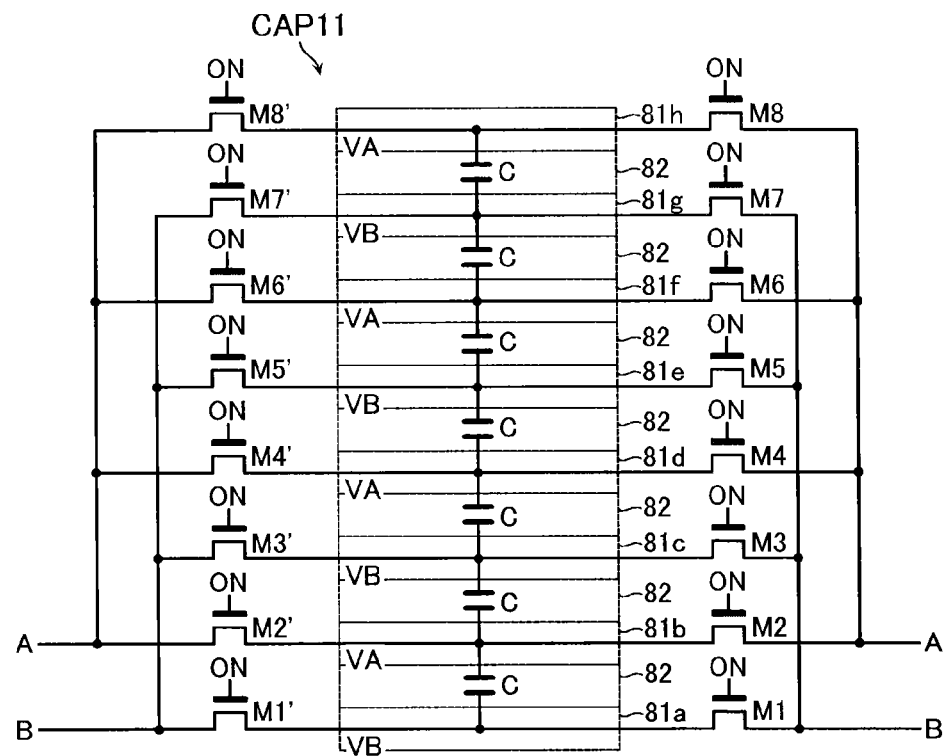
FIG. 10 is a diagram illustrating voltages applied to the conductive layers 81a to 81h in the capacitor CAP11 according to the first embodiment.

Next, the control of the capacitance of the capacitor CAP11 will be described with reference to FIGS. 9 and 10. As illustrated in FIGS. 9 and 10, the control circuit 17 controls the conductive state of the transistors M1 to M8 (M1' to M8') according to the voltages applied to the word line conductive layers 41*a* to 41*h*. In this way, the control circuit 17 controls the voltage applied to each of the conductive layers 81*a* to 81*h* to change the capacitance of the capacitor CAP11. Therefore, since the capacitance of the capacitor CAP11 is set according to a variation in the capacitances C_WL between the word lines WL1 to WL16, the boosting time of the booster circuit 16 is maintained to be constant.

For example, when the voltages are applied to the word line conductive layers 41*a* to 41*h* (word lines WL1 to WL16) as illustrated in FIG. 6A, the control circuit 17 turns on the transistors M3 to M5 and M3' to M5' and turns off the other transistors M1, M2, M6 to M8, M1', M2', and M6' to M8', as illustrated in FIG. 9. In this way, the voltage of the conductive layer 81*d* is set to a voltage VA, the voltage of the conductive layers 81*c* and 81*e* is set to a voltage VB (VB<VA), and the conductive layers 81*a*, 81*b*, and 81*f* to 81*h* become a floating state. Therefore, a voltage VA-VB is applied between the conductive layers 81*c* and 81*d* and between the conductive layers 81*d* and 81*e*, and two capacitances C between the conductive layers function as the capacitance of the capacitor CAP11.

For example, when the voltages are applied to the word line conductive layers 41*a* to 41*h* (word lines WL1 to WL16) as illustrated in FIG. 6B, the control circuit 17 turns on all of the transistors M1 to M8 and M1' to M8' as illustrated in FIG. 10. In this way, the voltage of the conductive layers 81*b*, 81*d*, 81*f*, and 81*h* is set to the voltage VA and the voltage of the conductive layers 81*a*, 81*c*, 81*e*, and 81*g* is set to the voltage VB. Therefore, the voltage VA-VB is applied between the conductive layers 81*a* to 81*h* and seven capacitances C between the conductive layers 81*a* to 81*h* function as the capacitance of the capacitor CAP11. In the example illustrated in FIG. 10, the capacitance C functioning as the capacitance of the capacitor CAP11 is more than that in the example illustrated in FIG. 9, due to a variation in the capacitances C_WL between the word lines WL1 to WL16.

Next, the detailed laminated structure of the capacitor CAP11 will be described with reference to FIG. 11.

Figure 11:
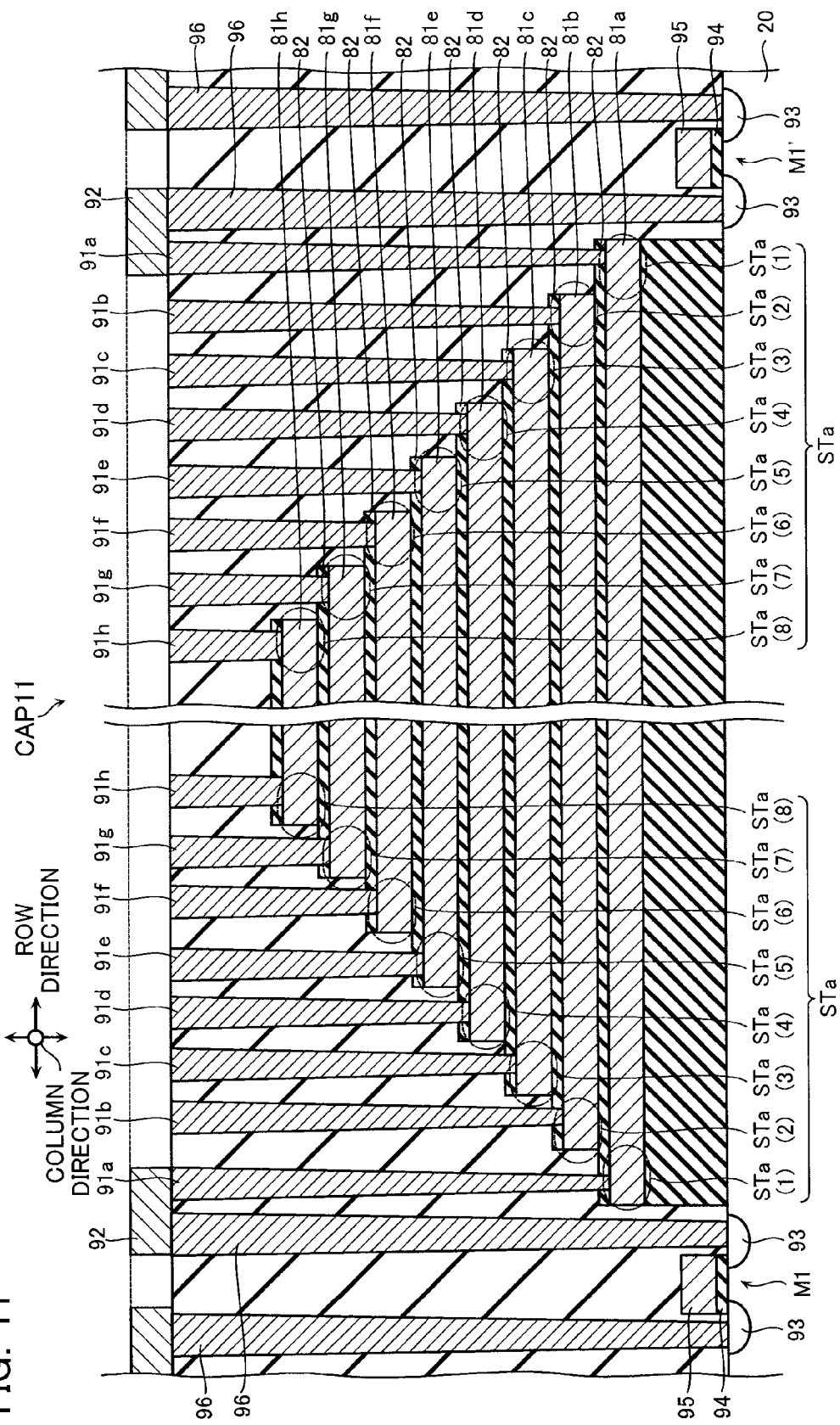
FIG. 11 is a cross-sectional view illustrating the detailed laminated structure of the capacitor CAP11.

As illustrated in FIG. 11, the conductive layers 81*a* to 81*h* and the interlayer insulating layers 82 are provided on the semiconductor substrate 20. The conductive layers 81*a* to 81*h* and the interlayer insulating layers 82 are formed in a step shape such that the positions thereof in the row direction are different from each other, thereby forming a step portion STa. The step portion STa includes steps (stages) STa(1) to STa(8) which are arranged in a line in the row direction. As illustrated in FIG. 11, the steps STa(1) to STa(8) are arranged from the bottom to the top.

The conductive layers 81*a* to 81*h* are formed on the same layers as the word line conductive layers 41*a* to 41*h*. The interlayer insulating layer 82 is formed on the same layer as the interlayer insulating layers 42. The conductive layers 81*a* to 81*h* and the interlayer insulating layers 82 are formed by the same process as that forming the word line conductive layers 41*a* to 41*h* and the interlayer insulating layers 42 and are then separated from the word line conductive layers 41*a* to 41*h* and the interlayer insulating layers 42.

Contract layers 91*a* to 91*h* which extend from the upper side are formed by the step portion STa. The contract layer 91*a* comes into contact with an upper surface (step STa(1)) of the conductive layer 81*a*. The contract layers 91*b* to 91*c* come into contact with upper surfaces (steps STa(2) to STa(8)) of the conductive layers 81*b* to 81*h*, respectively. A lead line 92 which extends in a direction parallel to the semiconductor substrate 20 is provided on upper surface of each of the contract layers 91*a* to 91*h*.

In addition, the transistors M1 and M1' are formed on the semiconductor substrate 20. Each of the transistors M1, and M1' includes a pair of diffusion layers 93, a gate insulating layer 94, and a gate electrode layer 95. The pair of diffusion layers 93 are provided on the surface of the semiconductor substrate 20 with a predetermined gap therebetween. The gate insulating layer 94 is provided on the semiconductor substrate 20 so as to be laid across the pair of diffusion layers 93. The gate electrode layer 95 comes into contact with an upper surface of the gate insulating layer 94.

Contract layers 96 are formed so as to extend from upper surfaces of the pair of diffusion layers 93 in the laminated direction. One of the contract layers 96 comes into contact with the lead line 92 and is electrically connected to the conductive layer 81*a* through the lead line 92 and the contract layer 91*a*.

As described above, the capacitor CAP11 includes the conductive layers 81*a* to 81*h* which are laminated. Therefore, in the first embodiment, an increase in the occupied area of the capacitor CAP11 (capacitive element) is prevented. In addition, in the first embodiment, as described above, the layers forming the capacitor CAP11 and the layers forming the memory string MS can be laminated by the same process. Therefore, it is possible to reduce the number of manufacturing processes.

Furthermore, in the first embodiment, even when the number of word line conductive layers 41*a* to 41*h* laminated and the gap therebetween are changed, it is not necessary to change the structure of the booster circuit 16.

[Second Embodiment]

Figure 12:
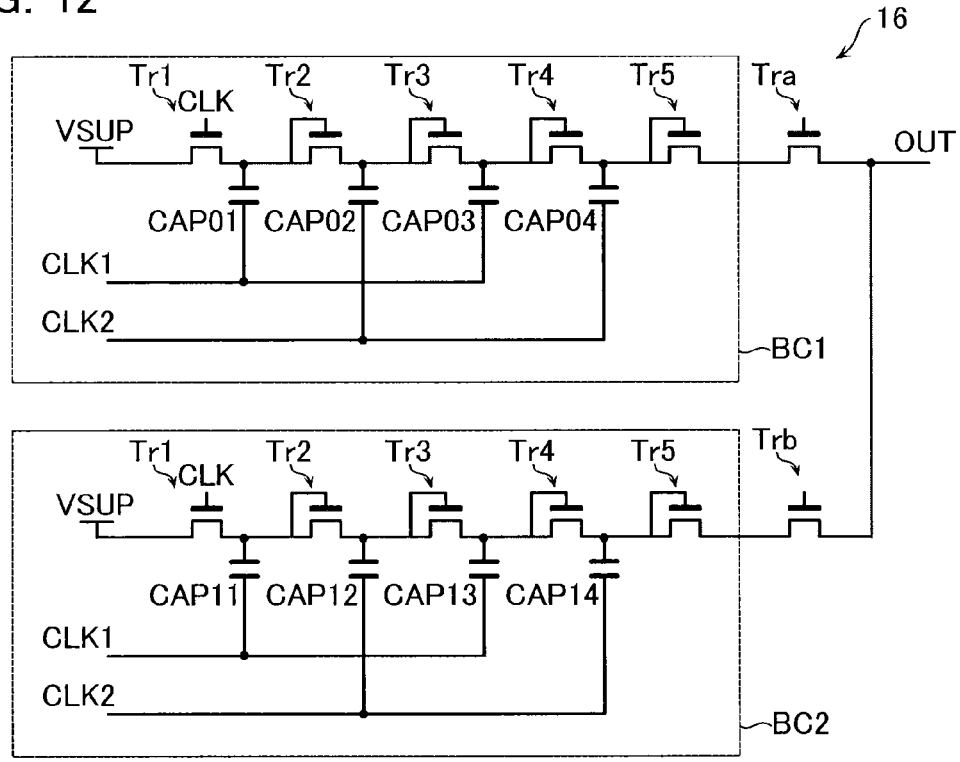
FIG. 12 is a circuit diagram illustrating a booster circuit 16 according to a second embodiment.

Next, a non-volatile semiconductor memory device according to a second embodiment will be described with reference to FIG. 12. The second embodiment differs from the first embodiment only in the structure of the booster circuit 16 illustrated in FIG. 12. In the second embodiment, the other structures are the same as those in the first embodiment and thus the detailed description thereof will not be repeated.

In the second embodiment, a booster unit BC1 includes capacitors CAP01 to CAP04, instead of the capacitors CAP11 to CAP14. The booster unit BC1 is different from that in the first embodiment only in that the capacitors CAP01 to CAP04 have substantially constant capacitances. A booster unit BC2 has the same structure as that in the first embodiment.

In the second embodiment, the boosting efficiency of the booster unit BC1 is determined according to substantially constant capacitances C_Tr and C_LINE (see FIG. 5). On the other hand, in the first embodiment, the boosting efficiency of the booster unit BC1 varies according to a variable capacitance C_WL. Therefore, in the second embodiment, it is possible to easily set the size of the transmission transistor Tra, as compared to the first embodiment. In addition, the second embodiment having the above-mentioned structure has the same effect as the first embodiment.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the voltages applied to the conductive layers 81*a* to 81*h* are not limited to the examples illustrated in FIGS.

Figure 13:
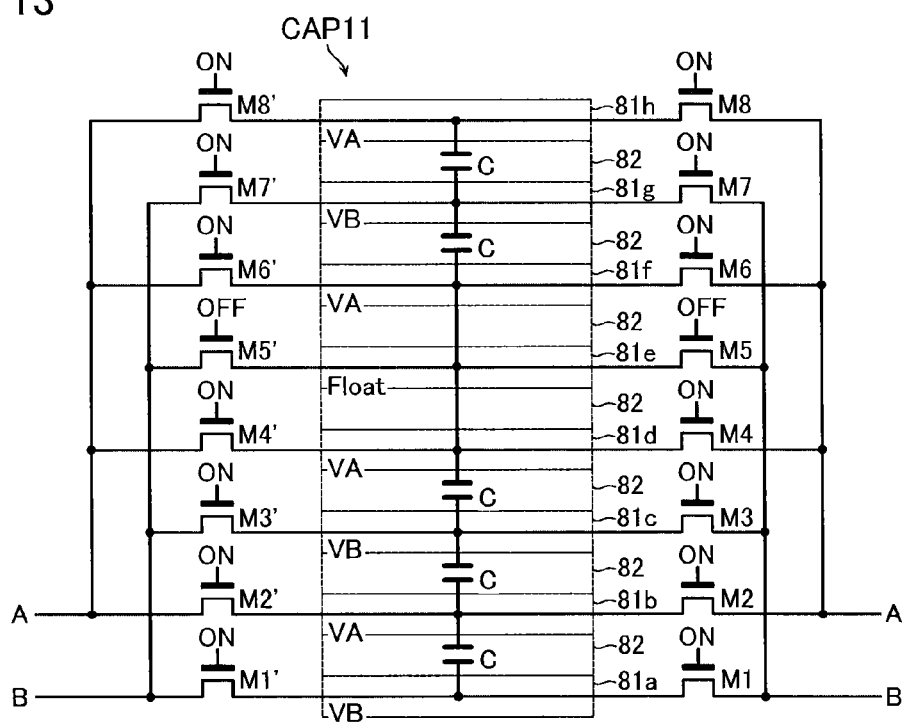
FIG. 13 is a diagram illustrating voltages applied to conductive layers 81a to 81h in a capacitor CAP11 according to another embodiment.

9 and 10. In this embodiment, the potential difference between the conductive layers 81a to 81d may be set according to increase or decrease in the surface area of the word line conductive layers 41a to 41d which are opposite to each other with a predetermined potential difference therebetween. For example, the potential difference between the word line conductive layers 41a to 41h may be set as illustrated in FIG. 13. In the example illustrated in FIG. 13, the control circuit 17 turns off the transistors M5 and M5' and turns on the other transistors M1 to M4, M6 to M8, M1' to M4', and M6' to M8'. In this way, the voltage of the conductive layers 81b, 81d, 81f, and 81h is set to the voltage VA, the voltage of the conductive layers 81a, 81c, and 81g is set to the voltage VB (VB<VA), and the conductive layer 81e becomes a floating state. In this case, the conductive layer 81e functions as a floating electrode, the voltage VA-VB is applied between the conductive layers 81a and 81b, between the conductive layers 81b and 81c, between the conductive layers 81c and 81d, between the conductive layers 81f and 81g, and between the conductive layers 81g and 81h, and the capacitance C therebetween functions as the capacitance of the capacitor CAP11.

What is claimed is:

1. A non-volatile semiconductor memory device comprising:
    a semiconductor substrate;
    a memory string provided above the semiconductor substrate and comprising a plurality of memory transistors connected in series, the plurality of memory transistors being stacked above the semiconductor substrate;
    a control circuit configured to control a voltage applied to the memory string and a first capacitor provided above the semiconductor substrate;
    a first booster circuit comprising a plurality of first capacitors and configured to boost a voltage;
    a second booster circuit comprising a plurality of second capacitors each having a substantially constant capacitance and configured to boost a voltage;
    a first transistor; and
    a second transistor,
    the first capacitor comprising a plurality of first conductive layers and second conductive layers, the first conductive layers functioning as a first electrode of the first capacitor, the second conductive layers functioning as a second electrode of the first capacitor, the first conductive layers and the second conductive layers being arranged alternately in the direction substantially perpendicular to the semiconductor substrate,
    the first transistor being connected to the first conductive layers,
    the second transistor being connected to the second conductive layers,
    the control circuit being configured to control voltages of gates of the first transistor and the second transistor according to voltages of gates of the plurality of memory transistors, thereby changing a capacitance of the first capacitor, and
    the control circuit being configured to be capable of setting a third conductive layer to a floating state, the third conductive layer being one of the first conductive layers and the second conductive layers, the control circuit being configured to be capable of applying a first voltage to the first conductive layers and the second conductive layers except for the third conductive layer.

2. A non-volatile semiconductor memory device comprising:
    a semiconductor substrate;
    a memory string provided above the semiconductor substrate and comprising a plurality of memory transistors connected in series, the plurality of memory transistors being stacked above the semiconductor substrate;
    a first capacitor provided above the semiconductor substrate; and
    a control circuit configured to control a voltage applied to the memory string and the first capacitor;
    the first capacitor comprising a plurality of first conductive layers and second conductive layers, the first conductive layers functioning as a first electrode of the first capacitor, the second conductive layers functioning as a second electrode of the first capacitor, the first conductive layers and the second conductive layers being arranged alternately in the direction substantially perpendicular to the semiconductor substrate, and
    the control circuit being configured to control a voltage applied to each of the plurality of first conductive layers and second conductive layers according to voltages of gates of the plurality of memory transistors, thereby changing a capacitance of the first capacitor.

3. The non-volatile semiconductor memory device according to claim 2, further comprising:
    a first transistor connected to the first conductive layers; and
    a second transistor connected to the second conductive layers,
    wherein the control circuit is configured to control voltages of gates of the first transistor and the second transistor.

4. The non-volatile semiconductor memory device according to claim 2, further comprising:
    a first booster circuit configured to boost a voltage,
    wherein the first booster circuit comprises a plurality of first capacitors.

5. The non-volatile semiconductor memory device according to claim 4, further comprising:
    a second booster circuit configured to boost a voltage,
    wherein the second booster circuit comprises a plurality of second capacitors each having a substantially constant capacitance.

6. The non-volatile semiconductor memory device according to claim 2,
    wherein the control circuit is configured to be capable of setting a third conductive layer to a floating state, the third conductive layer is one of the first conductive layers and the second conductive layers, the control circuit is configured to be capable of applying a first voltage to the first conductive layers and the second conductive layers except for the third conductive layer.

7. The non-volatile semiconductor memory device according to claim 3,
    wherein a plurality of first transistors are provided for one of the first conductive layers.

8. The non-volatile semiconductor memory device according to claim 3,
    wherein a plurality of second transistors are provided for one of the second conductive layers.

9. The non-volatile semiconductor memory device according to claim 2,
    wherein the plurality of first conductive layers and second conductive layers are arranged such that the ends thereof are disposed at different positions in a first direction parallel to the semiconductor substrate.

10. The non-volatile semiconductor memory device according to claim 2,
    wherein the memory string comprises:

a plurality of fourth conductive layers arranged at predetermined pitches in a direction substantially perpendicular to the semiconductor substrate and functioning as gates of the memory transistors;

a memory gate insulating layer contacting with side surfaces of the first conductive layers; and a first semiconductor layer having one side surface sandwiching the memory gate insulating layer with the plurality of first conductive layers, extending in the direction substantially perpendicular to the semiconductor substrate, and functioning as bodies of the memory transistors, each of the first conductive layers and the second conductive layers is provided on the same layer as each of the fourth conductive layers.

11. The non-volatile semiconductor memory device according to claim 10, wherein the plurality of fourth conductive layers are arranged such that the ends thereof are disposed at different positions in a first direction parallel to the semiconductor substrate.

12. The non-volatile semiconductor memory device according to claim 10, further comprising a first selection transistor having one end connected to one end of the memory string, wherein the first selection transistor comprises:

a fifth conductive layer functioning as a gate of the first selection transistor;

a first gate insulating layer contacting with a side surface of the fifth conductive layer; and a second semiconductor layer having a side surface sandwiching the first gate insulating layer with the fifth conductive layer, extending in the direction substantially perpendicular to the semiconductor substrate, and functioning as a body of the first selection transistor.

13. The non-volatile semiconductor memory device according to claim 12, further comprising a second selection transistor having one end connected to the other end of the memory string, wherein the second selection transistor comprises:

a sixth conductive layer functioning as a gate of the second selection transistor;

a second gate insulating layer contacting with a side surface of the sixth conductive layer; and a third semiconductor layer having a side surface sandwiching the second gate insulating layer with the sixth conductive layer, extending in the direction substantially perpendicular to the semiconductor substrate, and functioning as a body of the second selection transistor.

14. The non-volatile semiconductor memory device according to claim 10, wherein the first semiconductor layer comprises:

a pair of columnar semiconductor layers extending in the direction substantially perpendicular to the semiconductor substrate; and a joining semiconductor layer joining lower ends of the pair of columnar semiconductor layers.

15. The non-volatile semiconductor memory device according to claim 3, wherein the first transistor comprises a pair of first diffusion layers provided on the semiconductor substrate.

16. The non-volatile semiconductor memory device according to claim 15, wherein the second transistor comprises a pair of second diffusion layers provided on the semiconductor substrate.

17. A non-volatile semiconductor memory device comprising:

a semiconductor substrate;

a memory string provided above the semiconductor substrate and comprising a plurality of memory transistors connected in series, the plurality of memory transistors being stacked above the semiconductor substrate;

a first capacitor provided above the semiconductor substrate;

a first transistor;

a second transistor; and a control circuit configured to control a voltage applied to the memory string and the first capacitor, the first capacitor comprising a plurality of first conductive layers and second conductive layers, the first conductive layers functioning as a first electrode of the first capacitor, the second conductive layers functioning as a second electrode of the first capacitor, the first conductive layers and the second conductive layers being alternately in the direction substantially perpendicular to the semiconductor substrate, the first transistor being connected to the first conductive layers, the second transistor being connected to the second conductive layers, the control circuit being configured to control voltages of gates of the first transistor and the second transistor, thereby changing a capacitance of the first capacitor.

18. The non-volatile semiconductor memory device according to claim 17, further comprising:

a first booster circuit configured to boost a voltage, wherein the first booster circuit comprises a plurality of first capacitors.

19. The non-volatile semiconductor memory device according to claim 18, further comprising:

a second booster circuit configured to boost a voltage, wherein the second booster circuit comprises a plurality of second capacitors each having a substantially constant capacitance.

20. The non-volatile semiconductor memory device according to claim 17, wherein the control circuit is configured to be capable of setting a third conductive layer to a floating state, the third conductive layer is one of the first conductive layers and the second conductive layers, the control circuit is configured to be capable of applying a first voltage to the first conductive layers and the second conductive layers except for the third conductive layer.

* * * * *